US012379233B2

(12) United States Patent
Enzinna

(10) Patent No.: US 12,379,233 B2
(45) Date of Patent: Aug. 5, 2025

(54) PASSIVE CAPACITANCE SENSING

(71) Applicant: Advanced Energy Industries, Inc., Denver, CO (US)

(72) Inventor: Donald Enzinna, Lockport, NY (US)

(73) Assignee: Advanced Energy Industries, Inc., Denver, CO (US)

( * ) Notice: Subject to any disclaimer, the term of this patent is extended or adjusted under 35 U.S.C. 154(b) by 224 days.

(21) Appl. No.: 18/354,970

(22) Filed: Jul. 19, 2023

(65) Prior Publication Data

US 2025/0027792 A1 Jan. 23, 2025

(51) Int. Cl.
*G01D 5/24* (2006.01)
*G01R 27/26* (2006.01)
*H01L 21/683* (2006.01)

(52) U.S. Cl.
CPC ........... *G01D 5/24* (2013.01); *G01R 27/2605* (2013.01); *H01L 21/6833* (2013.01)

(58) Field of Classification Search
CPC .. G01D 5/24; G01R 27/2605; H01L 21/6831; H01L 21/6833; H01L 21/67253; H01L 21/67259; H02N 13/00
See application file for complete search history.

(56) References Cited

U.S. PATENT DOCUMENTS

| 4,022,990 | A * | 5/1977 | Bauer | H04M 1/24 |
| | | | | 379/24 |
| 9,097,748 | B2 * | 8/2015 | Aranovsky | G01R 27/2605 |
| 9,625,507 | B2 * | 4/2017 | Erdogan | G06F 3/0446 |
| 11,280,811 | B2 | 3/2022 | Enzinna | |
| 11,562,918 | B2 | 1/2023 | Match | |
| 2001/0018098 | A1 * | 8/2001 | Sun | A61K 9/2086 |
| | | | | 118/500 |
| 2008/0084650 | A1 * | 4/2008 | Balasubramanian | |
| | | | | H01J 37/32431 |
| | | | | 361/234 |

(Continued)

FOREIGN PATENT DOCUMENTS

| WO | WO-2006133082 A1 * | 12/2006 | ............... G01D 5/24 |
| WO | WO-2016208678 A1 * | 12/2016 | ............... G01D 5/12 |

OTHER PUBLICATIONS

WO 2016/208678 and translation (Year: 2016).*
PCT, International Search Report and Written Opinion issued in PCT/US2024/036626, Sep. 26, 2024, 19 pages.

*Primary Examiner* — Steven L Yeninas
(74) *Attorney, Agent, or Firm* — NOD Law PC

(57) ABSTRACT

Devices and methods for measuring capacitance of a load. A device may include a ground connector configured to couple to ground and an output connector configured to couple to the load. The device may include a direct current (DC) supply arranged in a conduction path between the ground connector and the output connector wherein the DC supply is configured to apply a DC voltage and noise voltage onto the conduction path. The device may include a voltage monitor configured to monitor the noise voltage applied by the DC supply and the device may include a current monitor configured to measure current in the conduction path that results from the noise voltage. The device may include a capacitance module coupled to the current monitor and voltage monitor, the capacitance module configured to determine the capacitance based upon the monitored current and noise voltage.

14 Claims, 5 Drawing Sheets

(56) References Cited

U.S. PATENT DOCUMENTS

| | | | |
|---|---|---|---|
| 2011/0032654 A1* | 2/2011 | McAnn | H01L 21/6833 361/234 |
| 2020/0400719 A1 | 12/2020 | Enzinna | |
| 2020/0411356 A1* | 12/2020 | Fujii | H02N 13/00 |
| 2022/0037177 A1 | 2/2022 | Fukuzaki | |
| 2022/0102179 A1* | 3/2022 | Ye | H01J 37/32183 |
| 2022/0244294 A1 | 8/2022 | Enzinna | |
| 2022/0334160 A1 | 10/2022 | Enzinna | |
| 2023/0130919 A1 | 4/2023 | Match | |

* cited by examiner

PASSIVE CAPACITANCE SENSING

BACKGROUND

Field

The present invention relates generally to monitoring electrical elements, and more particularly, to monitoring capacitance.

Background

Monitoring capacitance is important in many contexts. Among other contexts, monitoring capacitance is important when electrostatically holding a work piece to a chuck. Electrostatic chucks are used to support workpieces (e.g., wafers) in a variety of processing systems. In a deposition system, for example, an electrostatic chuck may be used to clamp a wafer in place while a thin film is deposited on the wafer. In an etch system, as another example, an electrostatic chuck may be used to clamp a wafer in place while material is being chemically etched from the wafer.

Electrostatic chucks use electrostatic force to hold the workpiece in place. An electrostatic chuck has electrodes that are energized with a clamping voltage, which electrostatically clamps the workpiece to the surface of the electrostatic chuck. The electrodes in the electrostatic chuck are coupled to an electrostatic power supply and a controller. The electrostatic power supply receives the control signal from the controller and generates a clamping voltage adapted to clamp the substrate with a clamping force.

Proper positioning of the workpiece relative to the electrostatic chuck is important at various times before, during, and after typical workpiece processes. For example, it is important to ensure that a workpiece is properly loaded onto the electrostatic chuck before applying the clamping voltage. As another example, it may be desirable to determine whether the workpiece is clamped or unclamped at certain times.

The electrostatic power supply may include a direct current (DC) voltage generator configured to generate a DC clamping voltage for the clamping electrode assembly of the electrostatic chuck and an alternating current (AC) voltage generator configured to generate an AC signal. The position of the workpiece may be detected by monitoring a capacitance of a combination of the workpiece and the electrostatic chuck. For example, when the workpiece is properly positioned on the electrostatic chuck, the sensed capacitance may be higher than when the workpiece is not properly positioned.

The varying level of current provided to the electrostatic chuck (in response to the application of the AC voltage) enables the capacitance of the electrostatic chuck to be monitored, and as a consequence, the position of the workpiece may be monitored by monitoring the current provided to the electrostatic chuck.

Processing techniques continue to move to higher power amplifiers with higher output currents, and these types of amplifiers can be bulky and lossy. DC power supplies can deliver high current in a relatively small form factor, but DC power supplies lack the ability to sense load capacitance.

SUMMARY

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

In some aspects, the techniques described herein relate to an apparatus for measuring capacitance of a load, the apparatus including: a ground connector configured to couple to ground; an output connector configured to couple to the load; a direct current (DC) supply arranged in a conduction path between the ground connector and the output connector wherein the DC supply is configured to apply a DC voltage and noise voltage onto the conduction path; and a voltage monitor configured to monitor the noise voltage applied by the DC supply; a current monitor configured to measure current in the conduction path that results from the noise voltage; a capacitance module coupled to the current monitor and voltage monitor, the capacitance module configured to determine the capacitance based upon the monitored current and noise voltage.

In other aspects, the techniques described herein relate to a method for monitoring capacitance of a load, the method including: applying, via a conduction path, a DC voltage and noise voltage to a load with a direct current (DC) supply; monitoring the noise voltage in the conduction path; monitoring current in the conduction path that results from the noise voltage; and determining a capacitance of the load based upon the monitored current and the monitored noise voltage.

DETAILED DESCRIPTION

The word "exemplary" is used herein to mean "serving as an example, instance, or illustration." Any embodiment described herein as "exemplary" is not necessarily to be construed as preferred or advantageous over other embodiments.

Disclosed herein are multiple approaches to monitoring capacitance. Although several aspects disclosed herein are separately described, they are not mutually exclusive, and instead, these aspects may be combined in multiple variations to provide improved capacitance sensing. Although the capacitance sensing techniques are described throughout this specification in the context of electrostatic chucking systems, it should be recognized that many of the capacitance-sensing approaches disclosed herein are applicable in other contexts where capacitance sensing is useful.

Figure 1:
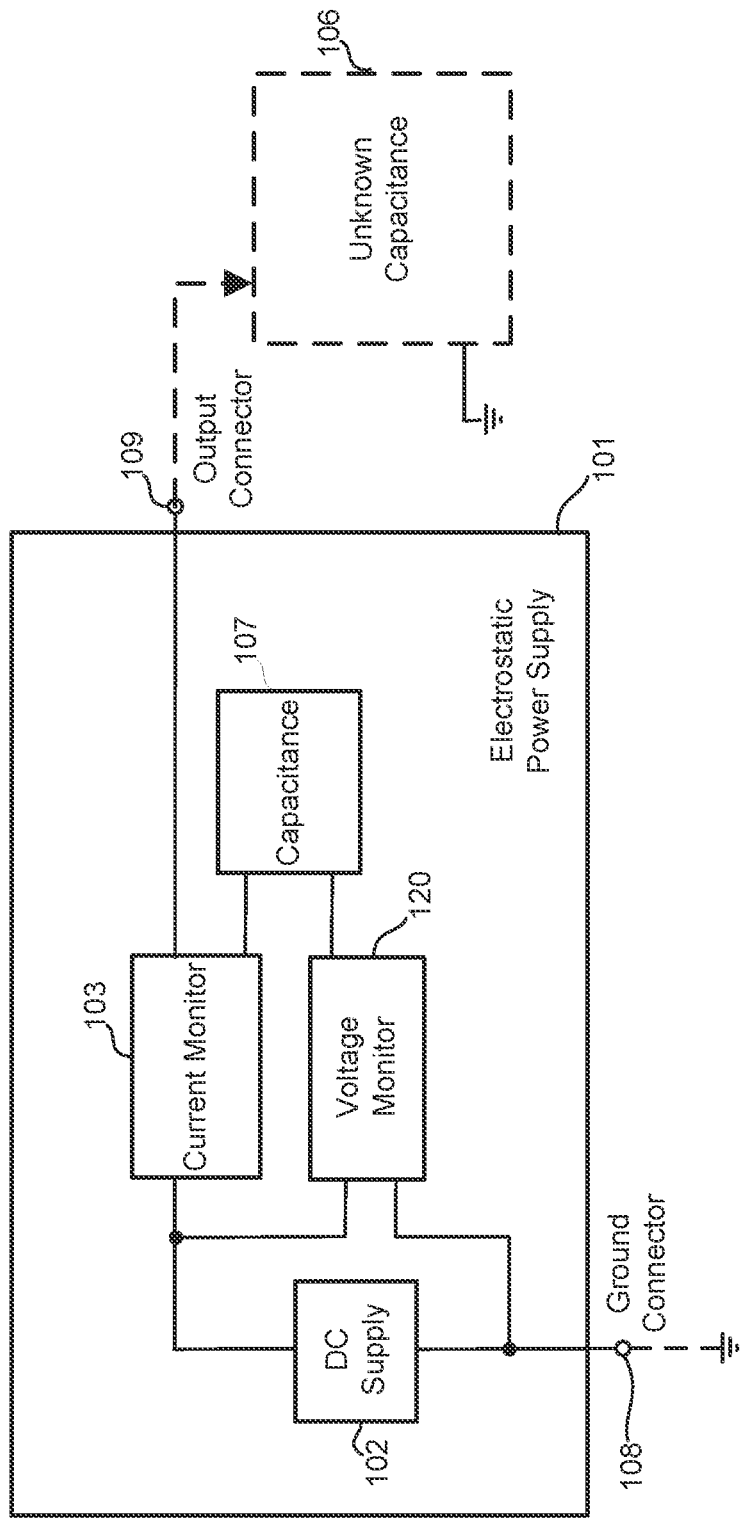
FIG. 1 illustrates an example of an electrostatic power supply.

Referring first to FIG. 1, shown is an exemplary electrostatic power supply 101, which is one environment in which embodiments of capacitance sensing techniques may be utilized. In general, the electrostatic power supply 101 is capable of applying a voltage that includes both steady-state and time-varying components, such as DC and time-varying components. For example, the DC voltage may effectuate a DC clamping voltage at an electrostatic chuck that draws a workpiece to the electrostatic chuck while the time-varying voltage may be utilized to monitor an unknown capacitance 106.

As shown, the electrostatic power supply 101 may include a ground connector 108 configured to couple to ground, an output connector 109 configured to couple to a load comprising the unknown capacitance 106, and a direct current (DC) supply 102. The DC supply 102 is arranged in a conduction path between the ground connector 108 and the output connector 109 and the DC supply 102 is configured to apply a DC voltage and noise voltage onto the conduction path. The DC supply 102, for example, may include one or more switching components such as field effect transistors or insulated gate bipolar transistors that introduce the noise voltage onto the conduction path. By way of further example, the DC supply may include a DC/DC converter that includes switching components and/or the DC supply may include a Class D, E, or F amplifier, which includes switching components that introduce the noise voltage onto the conduction path.

Also shown is a voltage monitor 120 that is configured to monitor the noise voltage applied by the DC supply 102, a current monitor 103 that is configured to measure current in the conduction path that is due to the noise voltage, and a capacitance module 107 that is coupled to the current monitor 103 and the voltage monitor 120. As discussed further herein, the capacitance module 107 is configured to determine the capacitance based upon the monitored current and noise voltage.

In operation, the DC voltage applied by the DC supply 102 may be used in connection with a variety of applications. As discussed further herein for example, the DC voltage may effectuate a DC clamping voltage when the electrostatic power supply 101 is coupled to an electrostatic chuck. For example, the DC supply 102 depicted in FIG. 1 may be capable of applying 1000 volts DC, but this voltage is only and example and may vary depending upon many factors. In many implementations, the DC supply 102 is realized, at least in part, by one or more switch-mode components, which can deliver high currents in a small form factor at high efficiency. The time-varying noise voltage injected by the DC supply 102 may be 200 to 500 millivolts at 18 to 20 kHz, but these voltages and frequencies are examples only and the specific magnitudes and frequencies may vary depending upon the many factors.

The current monitor 103 depicted in FIG. 1 (and throughout the drawing figures of the present disclosure) may be realized by a flux gate sensor, a hall effect sensor, resistive shunt sensor, or a current mirror circuit. The voltage monitor 120 may utilize a resistive divider that will yield a scaled version of the high voltage output.

Figure 2:
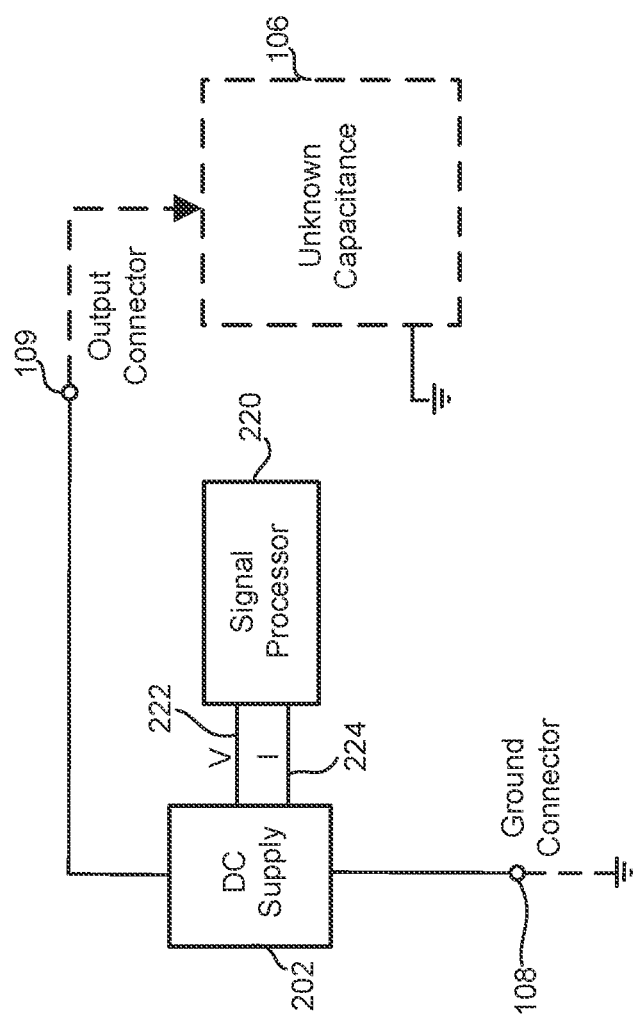
FIG. 2 illustrates an example of capacitance monitoring using voltage and current outputs of a DC supply.

In some implementations, as shown in FIG. 2, the capacitance monitoring aspects may be implemented as an add-on to a DC supply 202 that utilizes existing current and voltage monitoring of the DC supply 202. As shown, the DC supply 202 provides a noise voltage signal 222 and a current signal 224, and the capacitance module 107 described with reference to FIG. 1, may be realized by a signal processor 220.

In some implementations, the current measuring aspects (performed by the current monitor 103 or by the DC supply 202) may comprise an analog-to-digital converter used to convert an analog representation of the measured current into a digital signal representation of the measured current. In a similar manner, measured analog voltage signals of the present disclosure may be converted (e.g., by the voltage monitor 120 or DC supply 202) into a digital signal representation of the measured voltage. The capacitance monitoring aspects (e.g., the capacitance module 107 or signal processor 220) may process the digital signal representations of the measured current and voltage to determine the capacitance of the unknown capacitance 106. More specifically, capacitance may be determined by the basic equation: $C=Idt/dv$.

Figure 3:
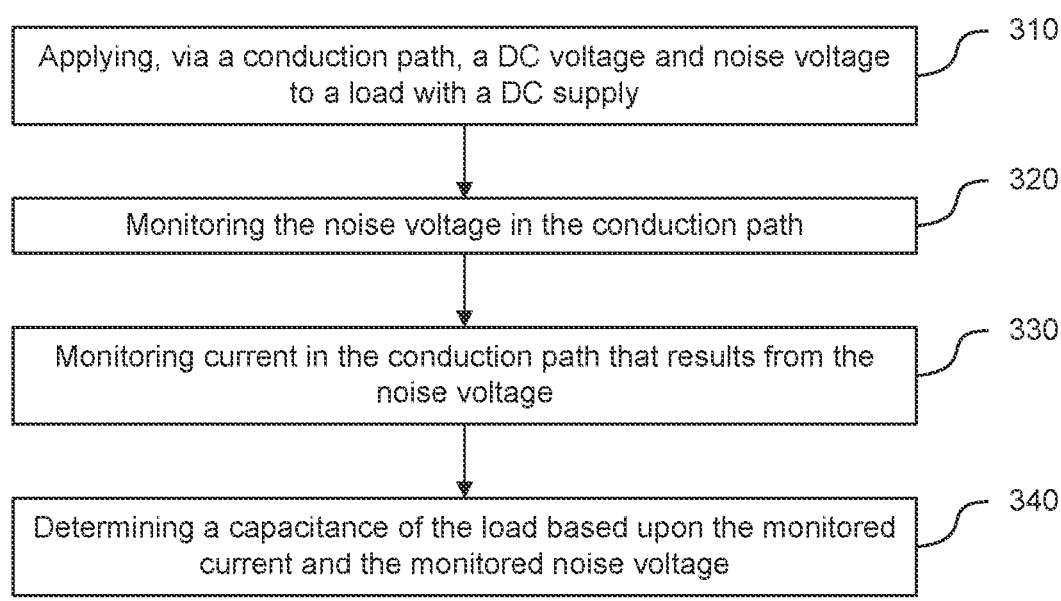
FIG. 3 is a flowchart depicting an exemplary method for determining capacitance of a load.

While referring to FIGS. 1 and 2, simultaneous reference is made to FIG. 3, which is a flowchart depicting a method for monitoring capacitance of a load that may be traversed in connection with embodiments disclosed herein. As shown at Block 310, the method includes applying, via a conduction path, a DC voltage and noise voltage to a load with a direct current (DC) supply (e.g., DC supply 101, 202). As discussed above, the noise voltage may be a byproduct from the switching of a DC/DC converter or Class, D, E, or F amplifier. In prior systems, this noise voltage was undesirable and often filtered out, but in embodiments disclosed herein, the noise voltage, at Block 320, in the conduction path is monitored, and at Block 330, current in the conduction path that results from the noise voltage is also monitored. At Block 340, a capacitance of the load is determined based upon the monitored current and the monitored noise voltage (e.g., using the basic equation: $C=Idt/dv$).

Figure 4:
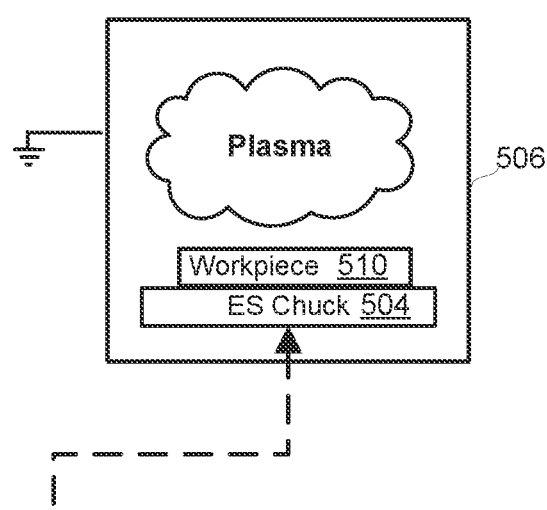
FIG. 4 is an example of a load.

Referring next to FIG. 4, shown is an example load that may have the unknown capacitance 108. As shown, the load includes a combination of an electrostatic chuck 504 and a workpiece 510, and the combined capacitance of the electrostatic chuck 504 and the workpiece 510 depends upon how firmly the workpiece 510 is clamped to an electrostatic chuck 504 of a plasma processing chamber 506. The plasma processing chamber 506 may be realized by any of a variety of chambers (e.g., comprising a vacuum enclosure which is evacuated by a pump or pumps (not shown)).

The DC voltage applied by the power supply 102, 202 may effectuate a DC clamping voltage at the electrostatic chuck 504 that draws the workpiece 510 to the electrostatic chuck 504 while the time varying noise voltage may be utilized to monitor a position of the workpiece 510 relative to the electrostatic chuck 504).

To detect a position of the workpiece 510 in the context of the electrostatic chucking system, the relationship between capacitance and positions of workpiece may be empirically determined, and threshold capacitances may be established that are indicative of, for example, the workpiece 510 "in place" or the workpiece 510 "in clamp." The threshold capacitance values may be stored in nonvolatile memory in connection with workpiece position data to enable a mapping between capacitance values and workpiece position. Once the capacitance of the load (e.g., the combination of the electrostatic chuck 504 and the workpiece 510) is obtained, the position of the workpiece 510 may be obtained by reference to the stored data in nonvolatile memory.

In this exemplary application, the plasma processing chamber 106 may be realized by chambers of substantially conventional construction (e.g., comprising a vacuum enclosure which is evacuated by a pump or pumps (not shown)). And, as one of ordinary skill in the art will appreciate, the plasma excitation in the plasma processing chamber 106 may be achieved by any one of a variety of sources comprising, for example, a helicon type plasma source, which includes magnetic coil and antenna to ignite and sustain a plasma 114 in the reactor, and a gas inlet may be provided for introduction of a gas into the plasma processing chamber 106.

As depicted, the workpiece 110 to be treated (e.g., a semiconductor wafer), is supported at least in part by the electrostatic chuck 104, and power is applied to the electrostatic chuck 104 via one or more conductors (e.g., cables). For simplicity only a single conductor is shown coupled the electrostatic chuck 104, but it should be recognized that aspects described herein are applicable to monopolar chucks and multipolar chucks.

Figure 5:
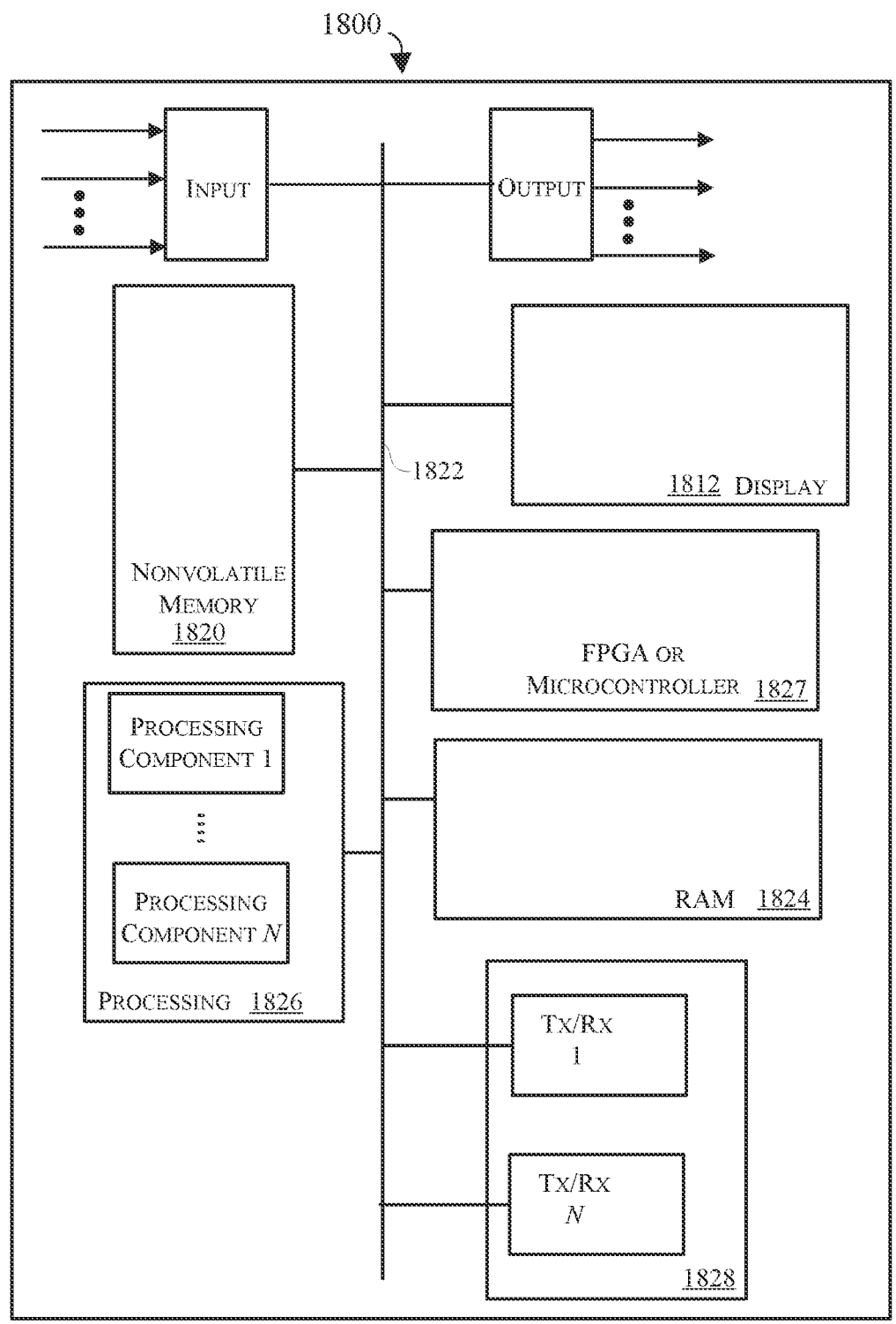
FIG. 5 is an exemplary block diagram depicting physical processing components that may be used to realize aspects described herein.

As described above, the functions and methods described in connection with the embodiments disclosed herein may be effectuated utilizing hardware, in processor executable instructions encoded in non-transitory machine readable medium, or as a combination of the two. Referring to FIG. 5 for example, shown is a block diagram depicting physical components that may be utilized to realize one or more aspects of the capacitance sensing technologies disclosed herein including the method described with reference to FIG. 3. As shown, a display 1812 and nonvolatile memory 1820 are coupled to a bus 1822 that is also coupled to random access memory ("RAM") 1824, a processing portion (which includes N processing components) 1826, a field programmable gate array (FPGA) 1827, and a transceiver component 1828 that includes N transceivers. Although the components depicted in FIG. 5 represent physical components, FIG. 5 is not intended to be a detailed hardware diagram; thus, many of the components depicted in FIG. 5 may be realized by common constructs or distributed among additional physical components. Moreover, it is contemplated that other existing and yet-to-be developed physical components and architectures may be utilized to implement the functional components described with reference to FIG. 5.

The display 1812 generally operates to provide a user interface for a user, and in several implementations, the display 1812 is realized by a touchscreen display. For example, display 1812 can be implemented as a part of the current and voltage monitors and capacitance modules to enable a user to change settings of the systems disclosed herein and/or receive operational feedback about the systems comprising workpiece (e.g., wafer) position information and capacitance information.

In general, the nonvolatile memory 1820 is non-transitory memory that functions to store (e.g., persistently store) data and machine readable (e.g., processor executable) code (comprising executable code that is associated with effectuating the methods described herein). In some embodiments, for example, the nonvolatile memory 1820 includes bootloader code, operating system code, file system code, and non-transitory processor-executable code to facilitate the execution of the methods described herein. The nonvolatile memory 1820 may also be used to store empirically obtained data that relates workpiece position to capacitance data.

In many implementations, the nonvolatile memory 1820 is realized by flash memory (e.g., NAND or ONENAND memory), but it is contemplated that other memory types may also be utilized. Although it may be possible to execute the code from the nonvolatile memory 1820, the executable code in the nonvolatile memory is typically loaded into RAM 1824 and executed by one or more of the N processing components in the processing portion 1826.

In operation, the N processing components in connection with RAM 1824 may generally operate to execute the instructions stored in nonvolatile memory 1820 to realize the functionality of one or more components and modules disclosed herein. As one of ordinary skill in the art will appreciate, the processing portion 1826 may include a video processor, digital signal processor (DSP), graphics processing unit (GPU), and other processing components. In digital implementations, a DSP may be used to effectuate aspects of the time-varying signal injection.

In addition, or in the alternative, the field programmable gate array (FPGA) 1827 may be configured to effectuate one or more aspects of the functions and methodologies described herein. For example, non-transitory FPGA-configuration-instructions may be persistently stored in nonvolatile memory 1820 and accessed by the FPGA 1827 (e.g., during boot up) to configure the FPGA 1827 to effectuate the functions described herein.

The input component may operate to receive signals (e.g., from voltage and current sensors) that are indicative of the monitored time-varying noise voltage and associated current. And the output component generally operates to provide one or more analog or digital signals to effectuate an operational aspect of components described herein. For example, the output portion may transmit output signal(s) indicative of capacitance to workpiece position modules.

The depicted transceiver component 1828 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus for measuring capacitance of a load, the apparatus comprising:
   a ground connector configured to couple to ground;
   an output connector configured to couple to the load;
   a direct current (DC) supply arranged in a conduction path between the ground connector and the output connector wherein the DC supply is configured to apply a DC voltage and noise voltage onto the conduction path; and
   a voltage monitor configured to monitor the noise voltage applied by the DC supply;
   a current monitor configured to measure current in the conduction path that results from the noise voltage;
   a capacitance module coupled to the current monitor and voltage monitor, the capacitance module configured to determine the capacitance based upon the monitored current and noise voltage.

2. The apparatus of claim 1, wherein the direct current (DC) supply comprises an amplifier selected from the group of Class A, Class B, Class AB, Class D, Class E, and Class F amplifiers.

3. The apparatus of claim 1, wherein the DC supply comprises a switch mode power supply.

4. The apparatus of claim 1, wherein the current monitor includes one or more of a flux gate sensor, a resistive shunt sensor, a hall effect sensor, or a current mirror circuit.

5. The apparatus of claim 1, wherein the voltage monitor is configured to monitor a rate of change of the noise voltage.

6. The apparatus of claim 1, wherein the capacitance module is configured to determine the capacitance by processing digital signal representations of the monitored current and noise voltage.

7. The apparatus of claim 1, wherein the current monitor is a high-side monitor.

8. The apparatus of claim 1, wherein the current monitor is a low-side monitor.

9. A method for monitoring capacitance of a load, the method comprising:
applying, via a conduction path, a DC voltage and noise voltage to a load with a direct current (DC) supply;
monitoring the noise voltage in the conduction path;
monitoring current in the conduction path that results from the noise voltage; and
determining a capacitance of the load based upon the monitored current and the monitored noise voltage.

10. The method of claim 9, wherein the applying includes applying the noise voltage by creating switching noise.

11. The method of claim 10, wherein creating switching noise comprises creating switching noise with at least one of a DC-DC converter, a Class D amplifier, or a Class E amplifier.

12. The method of claim 9, wherein applying comprises applying the DC voltage and noise voltage to an electrostatic chuck, and wherein determining a capacitance comprises determining a capacitance of at least a portion of the electrostatic chuck.

13. The method of claim 12 comprising:
determining a workpiece position based upon the capacitance of the electrostatic chuck.

14. The method of claim 9, wherein monitoring the noise voltage in the conduction path comprises monitoring a rate of change of the noise voltage.

* * * * *